United States Patent [19]

Thillays et al.

[11] 4,387,385
[45] Jun. 7, 1983

[54] DISPLAY DEVICE COMPRISING LIGHT-EMISSIVE DIODES

[75] Inventors: Jacques C. Thillays, Herouville; Robert Thevenon, Sainte Honorine du Faye, both of France

[73] Assignee: U.S. Philips Corporation, New York, N.Y.

[21] Appl. No.: 209,792

[22] Filed: Nov. 24, 1980

[30] Foreign Application Priority Data

Nov. 28, 1979 [FR] France .............................. 79 29310

[51] Int. Cl.³ .......................................... H01L 33/00
[52] U.S. Cl. ......................................... 357/17; 357/72
[58] Field of Search ........................... 357/17, 30, 72; 313/500

[56] References Cited

U.S. PATENT DOCUMENTS 2,809,332 10/1957 Sherwood ............................... 357/72
3,818,279 6/1974 Seeger, Jr. ............................. 357/72
4,168,102 9/1979 Chida ................................ 313/500 X Primary Examiner—Martin H. Edlow
Attorney, Agent, or Firm—Norman N. Spain

[57] ABSTRACT

Display device comprising several electroluminescent semiconductor crystals 12 provided on a base 10 and which furthermore comprises a block 13 with apertures 14 which form light conductors and a filter 16 on the upper side, the base and the block being manufactured from the same thermoplastic material, internal electric connections consisting of layers of conductive thermosetting resin.

Apparatus using display devices.

7 Claims, 3 Drawing Figures

DISPLAY DEVICE COMPRISING LIGHT-EMISSIVE DIODES

BACKGROUND OF THE INVENTION

The invention relates to a display device comprising several electroluminescent semiconductor crystals situated on a base, a light conductor having apertures provided in a block being present above each of the electroluminescent semiconductor crystals, the upper side of the block being covered with a light filter.

From a point of view of manufacture the display devices may be divided into two large groups. In the first group the composing parts are incorporated in a resin which, after curing, ensures the mechanical coherence of the assembly; this resin fills all the intermediate spaces and in particular the light conductors. In the second group the component parts are united mechanically, for example, by soldering, and the light conductors generally contain only air.

The invention relates to this latter group of display devices of which an embodiment is disclosed in French Patent Specification No. 2,207,618 corresponding to U.S. Pat. No. 3,786,499. According to this patent specification the crystals are situated on a metal plate positioned on a substrate through which connection pins have been provided. Each crystal is connected to one of the said pins by means of a wire. An apertured block of plastic material is positioned above the plate and the crystals, each aperture being located opposite to a crystal and forming the light conductor of said crystal. The walls of the apertures are coated with a reflecting metal layer. The surface remote from the crystals of the apertured block is covered by a lid of a transparent plastic material which forms a light scattering lens. The side faces of this lid extends along the block and around the substrate so that the device is closed.

In the most recent devices of this type the metal plate is replaced by a printed circuit and the light conductive block is manufactured from a thermoplastic material having a pigment which has such a high reflecting power that the walls of the cavities need no longer be coated with a metal layer.

These known devices have the disadvantages of high production costs which is determined in particular by the manufacture of the printed circuit or substrate, the partial silver-plating or gold-plating of electric connection elements and the operations necessary for assembly.

It is also to be noted that the optimum conditions for the optical efficiency are not ideal due to on the one hand the partial screening by the presence of wire connections on the crystal and on the other hand the low reflectivity of the bottom of the light conductors, said bottom being sometimes coated with an anti-reflective layer, for example, in the device described in French Patent Specification No. 2,207,618, so as to attenuate disturbing optical interferences between adjacent light conductors.

An object of the instant invention is to provide a display device of the type described in the opening paragraph, the construction of which is simplified as compared to the prior art devices and in which is free of the above-mentioned technical disadvantages of the prior art devices. A further object of the invention is to provide a structure for such a display device by which it is possible to realize a considerable reduction in manufacturing cost. This and other aspects of the invention will be apparent from the description that follows.

According to the invention, a display device of the kind mentioned in the opening paragraph is characterized in that the base has laminated thereto electric connection elements manufactured from an electrically conductive thermo-setting resin, each of the electroluminescent semiconductor crystals bears on at least two of the electric connection elements on the base at the by input and output current regions provided laminated to a surface of said crystal, while the block bears on the base in contact with the laminated connection elements and that the base and the block are manufactured from the same thermoplastic material.

As a result of the fact that the base is manufactured from the same material as the block both parts have the same coefficients of shrinkage upon moulding and the same coefficients of expansion upon heating, which is favourable for the mutual cooperation of these parts after assembly.

The block and the base may be made from a thermoplastic material filled with a white-tinted pigment, which makes these parts opaque but gives the surface thereof, in particular the walls of the light conductors, reflective properties which are at least equal to those of the silver-plated or gold-plated surfaces. Since the block bears on the connection elements laminated to the base and as a result is so substantially in contact with the base, the advantage is obtained that the possibility of optical interference between adjacent light conductors is removed.

The use of the network of electric connection elements of a thermo-curing conductive resin results in a production cost of the device which is considerably lower than that of known devices in which printed circuit panels are used. Furthermore, a change of the network can more easily be carried out than in a printed wiring assembly panel.

Another aspect of the invention relates to the method of manufacturing a sub-assembly formed by the base, the network of connection elements and the semiconductor crystals connected to said network. According to this aspect of the invention in a first series of operations the network of electric connection elements is formed, for example, by silk screening, of an electrically conductive thermo-curable resin on a thermoplastic base, the electroluminescent semiconductor crystals are then placed on the still curable plastic resin with their current input and output surfaces suitably positioned on appropriate parts of the connection elements, and in a second series of operations the sub-assembly thus formed is then brought at such a temperature, in a given atmosphere and for a given period of time that the curing and connection of the electrically conductive thermo-curable resin to the base takes place simultaneously with the connection and the electric connection of the semiconductor crystals, after which the sub-assembly, the block and the light filter are combined.

The temperature and operation time may vary as a function of the nature of the resin used, on the understanding that the material of the base can withstand the treatment employed.

As a result the crystals are directly connected to the network of connection elements without the need for the use of wire connections which screen a part of the crystal.

The direct connection of the crystals therefore results in improving the brightness of the device by removing the cause of the partial screening.

DESCRIPTION OF THE PREFERRED EMBODIMENT

Figure 1:
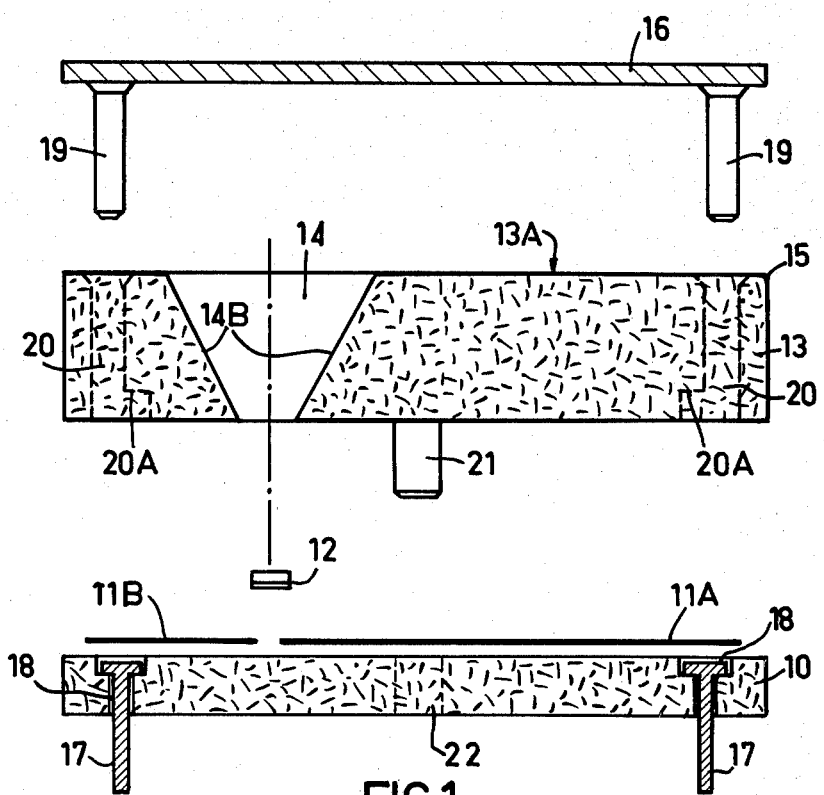
FIG. 1 is a sectional view of components for the manufacture of a device according to the invention.
Figure 3:
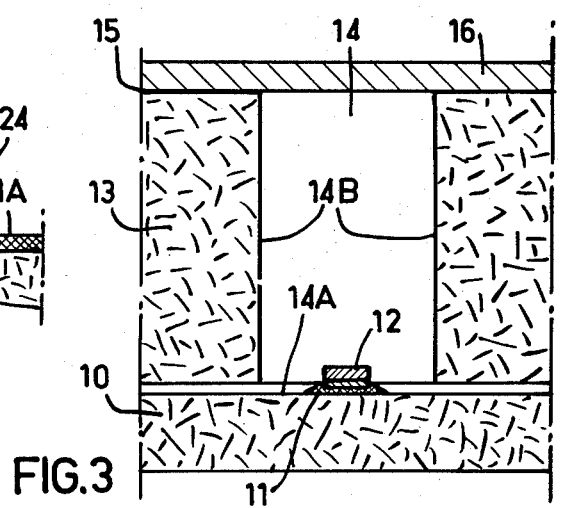

A display device according to the invention as shown in FIGS. 1 and 3 is formed on a base 10 which at its surface comprises layer-shaped electric connection elements 11, for example the elements 11A and 11B. Electroluminescent semiconductor crystals, for example, the crystal 12, are provided on the base.

Provided on the base 10 is a block 13 in which apertures are present, for example the aperture 14, which after the assembly of the device are situated opposite to the semiconductor crystals and constitute light conductors for these crystals. The apertures have a cross-section which increases regularly from their base, where they surround the semiconductor crystals, towards their top. The width of the light conductors or apertures remains constant. This is seen in FIG. 1 the aperture 14 is viewed in the longitudinal direction, and in FIG. 3 where it is viewed in its width direction. As is known current display devices comprise seven of such holes which are provided so as to form substantially two adjacent squares.

On its upper surface 13A the block 13 is covered with a layer of black paint 15 so as to accentuate the contrast between the light beams originating from the various conductors and the ambient light.

A flat light filtration panel 16 is placed on the upper surface 13A of block 13 which for each conductor serves to filter the light and to scatter said light regularly over the whole output surfaces of said light conductor.

Figure 2:
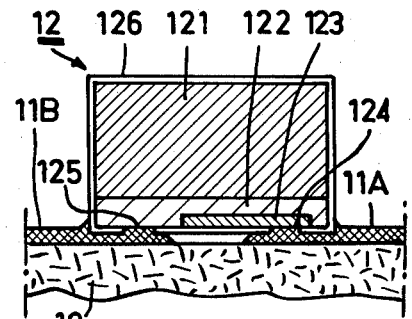
FIG. 2 is a sectional view on an enlarged scale of a part of FIG. 1 which shows the details of a crystal and the electric connections thereof and FIG. 3 is a sectional view on an enlarged scale of a part of FIG. 1 in which the composing parts are assembled.

FIG. 2 shows in detail the semiconductor crystal 12 such as a gallium phosphide diode or of gallium arsenide phosphide and shows a substrate 121 of the N+ type on which an epitaxial layer 122 of the N-type is deposited. Within the limits of a part of the surface of the layer 122 a P+ region 123 is formed so as to obtain an electroluminescent P-N junction. The contacts on the crystals are provided through the insulating layer 126, directly on the P+ region (input region 124) and on the N region (output region 125) provided with gold-silicon.

FIG. 1 further shows conductive connector pins 17, each furnished with a head, pins accomodated and connected in corresponding cavities 18 of the base 10. The panel 16 also comprises two pins 19 which serve for the connection of the panel to the block 13 by means of cavities 20. A guide pin 21 which adjoins the block 13 corresponds to a hole 22 provided in the base 10 which facilitates the assembly of the device and permits the locking after completion of the assembly.

In the display device described the light conductor 14 has a base 14A and side walls 14B formed from the same reflective material. An of the semiconductor crystals 12 bears current input and output regions 124 and 125 bears on at least two of the electrical connection elements 11A and 11B of the base 10. The base 10 and the block 13 are formed from the same thermoplastic material for example saturated polyesters, polycarbonates, polyamides and polysulphones. Particularly suitable are polyesters, for example polybutylene terephthalate and polyethylene terephthalate. These thermoplasts are made opaque and reflective by the addition of 10 to 30% titanium oxide powder. The layer-shaped connection elements 11A and 11B are manufactured from an electrically conductive thermocuring resin for which an epoxy resin or a silicone resin may be chosen, in which resin silver grains are incorporated. A two-components bisphenol A epoxy resin is preferably used, in which resin and hardener are both provided with silver grains. The thickness of the layers is between 5 and 30 $\mu$m.

The panel 16 is manufactured from semicrystalline thermoplastic material, for example propylene or polyester, and can thus simultaneously fulfil satisfactorily the function of filter and of light scatterer.

In the manufacture of a display device according to the invention, first of all a sub-assembly is manufactured comprising the base and the crystals. As shown in FIG. 1 pins 17 with heads are placed in the base cavities 18. The network of the electrical connection layer 11 is then found on the surface of the base 10 from the electrically conductive thermocurable resin by silk screening or an offset procedure at the same time a drain of this resin being provided in each of the cavities 18 thus insuring that each of the pin heads 17 are properly contacted with the electric connection layers 11.

The sub-assembly is now subjected to a thermal treatment. With the above-mentioned materials a temperature of 150° C. (140° to 160° C.) is chosen with an atmosphere of dry air; the treatment lasts from 30 to 60 minutes. The treatment may be carried out in two parts, if necessary, one part after inserting the pins, the other part after providing the crystals.

The assembly of the device after the manufacture of the sub-assembly is simple and rapid. First of all the panel 16 is provided on the block 13, the pins 16 penetrate into the cavities 20. The end of the pins 19 is then heated, for example by means of a soldering iron, so as to obtain a softening and flattening of the said end, as a result of which the end is adapted to fit the base 20A of the cavities 20 and the two components 13 and 16 are locked. The block 13 comprising the panel 16 is then mounted on the base 10. The guide pin 21 penetrates into the hole 22 and, as done before by local heating of the pins 19, the end of the guide pin 21 is deformed so that it obtains a flat portion near the lower surface of the base 10 around the hole 22 and thus locks the device.

The display device thus formed has a considerably lower production cost than that of known devices. This is due for a considerable part to the much lower production cost of the base employed compared with that of the commonly used bases with printed wiring and also to the small number of operations necessary for assembly.

We claim:

1. A light-emitting display device comprising a base formed of a thermoplastic resin, electric connection elements formed of layers of an electrically conductive thermosetting resins laminated to a surface of said base, doped electroluminescent semiconductor crystals each having a surface provided with current output and current input regions and each bearing on at least two of said electric connection elements at their current input and current output regions, an aperture providing block formed of the thermoplastic resin employed in forming said base bearing on said base in contact with said electric conductive elements, with each of said apertures positioned above one of said crystals and forming light conductors for each of said crystals and a light filter covering the surface of said block remote from said base.

2. A display device as claimed in claim 1, wherein the material of the base and the block is chosen from saturated polyesters, polycarbonates, polyamides and polysulphones, to which material titanium oxide has been added.

3. A display device as claimed in claim 2, wherein the material of the base and the block is chosen from polybutylene terphthalate and polyethylene terephthalate.

4. A display device as claimed in any of the claims 2, 3 or 1, wherein the laminated electric connection elements are manufactured from an electrically conductive thermosetting resin selected from the groups of epoxy resins and silicone resins.

5. A display device as claimed in claim 4, wherein the said thermosetting resin is a bisphenol epoxy resin containing a hardener and that silver grains are present in said two components.

6. A display device as claimed in any of the claims 1 to 5, characterized in that the filter is manufactured from a semicrystalline thermoplastic material.

7. A display device as claimed in claim 6, wherein the filter is manufactured from a material selected between polypropylene and polyester.

* * * * *